(12) United States Patent
Kubo et al.

(10) Patent No.: US 9,818,576 B2
(45) Date of Patent: Nov. 14, 2017

(54) ELECTRON MICROSCOPE

(71) Applicant: Hitachi High-Technologies Corporation, Minato-ku, Tokyo (JP)

(72) Inventors: Takashi Kubo, Tokyo (JP); Hiroyuki Kobayashi, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 15/022,436

(22) PCT Filed: Oct. 31, 2014

(86) PCT No.: PCT/JP2014/079148
§ 371 (c)(1),
(2) Date: Mar. 16, 2016

(87) PCT Pub. No.: WO2015/068669
PCT Pub. Date: May 14, 2015

(65) Prior Publication Data
US 2016/0225581 A1 Aug. 4, 2016

(30) Foreign Application Priority Data

Nov. 7, 2013 (JP) .................................. 2013-230776

(51) Int. Cl.
*H01J 37/22* (2006.01)
*H01J 37/26* (2006.01)
*H01J 37/10* (2006.01)

(52) U.S. Cl.
CPC ............ *H01J 37/222* (2013.01); *H01J 37/10* (2013.01); *H01J 37/22* (2013.01); *H01J 37/261* (2013.01);

(Continued)

(58) Field of Classification Search
CPC .......... H01J 2237/045; H01J 2237/103; H01J 2237/221; H01J 2237/248;
(Continued)

(56) References Cited

U.S. PATENT DOCUMENTS 7,109,485 B2 * 9/2006 Takane ...................... G06T 5/50
250/307
8,993,961 B2 * 3/2015 Tsuneta .................. H01J 37/265
250/306

(Continued)

FOREIGN PATENT DOCUMENTS

JP 2009-110788 A 5/2009

OTHER PUBLICATIONS

International Search Report (PCT/ISA/210) issued in PCT Application No. PCT/JP2014/079148 dated Dec. 2, 2014 with English translation (four pages).

(Continued)

*Primary Examiner* — Wyatt Stoffa
(74) *Attorney, Agent, or Firm* — Crowell & Moring LLP

(57) ABSTRACT

To improve the workability of the task of adjusting the position of a limit field diaphragm. An electron microscope provided with an image-capturing means for capturing an image of an observation visual field prior to insertion of a limit field diaphragm as a map image, a recording means for recording the map image, an extraction means for capturing an image of the observation visual field after insertion of the limit field diaphragm and extracting the outline of the diaphragm, a drawing means for drawing the outline on the map image, and a display means for displaying the image drawn by the drawing means.

10 Claims, 8 Drawing Sheets

(52) U.S. Cl.
CPC ....... *H01J 37/263* (2013.01); *H01J 2237/045* (2013.01); *H01J 2237/103* (2013.01); *H01J 2237/221* (2013.01); *H01J 2237/248* (2013.01); *H01J 2237/2602* (2013.01)

(58) Field of Classification Search
CPC .... H01J 2237/2602; H01J 37/10; H01J 37/22; H01J 37/222; H01J 37/261; H01J 37/263
See application file for complete search history.

(56) References Cited

U.S. PATENT DOCUMENTS

| | | | |
|---|---|---|---|
| 2012/0104253 A1* | 5/2012 | Tsuneta | H01J 37/20 250/307 |
| 2015/0060666 A1* | 3/2015 | Hatakeyama | H01J 37/244 250/307 |

OTHER PUBLICATIONS

Japanese-language Written Opinion (PCT/ISA237) issued in PCT Application No. PCT/JP2014/079148 dated Dec. 2, 2014 (three pages).

Edited by Ueda, "Experimental Physics Course 23—Electron Microscope", 1982, pp. 24-27, 380-385, and 393-395, Kyoritsu Shuppan Co., Ltd., with partial English translation.

Horiuchi, "High-Resolution Electron Microscope—Principle and Use Method", 1988, pp. 12-13 and 142-143, Kyoritsu Shuppan Co., Ltd., with English translation.

* cited by examiner

FIG. 1
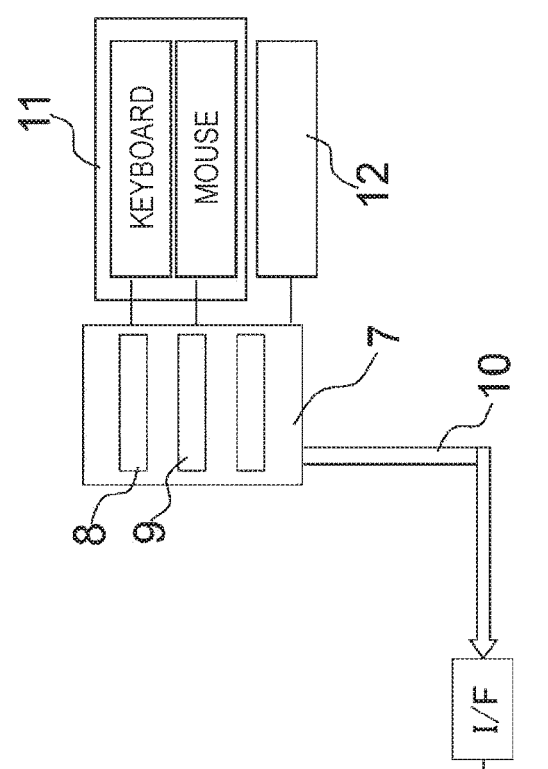
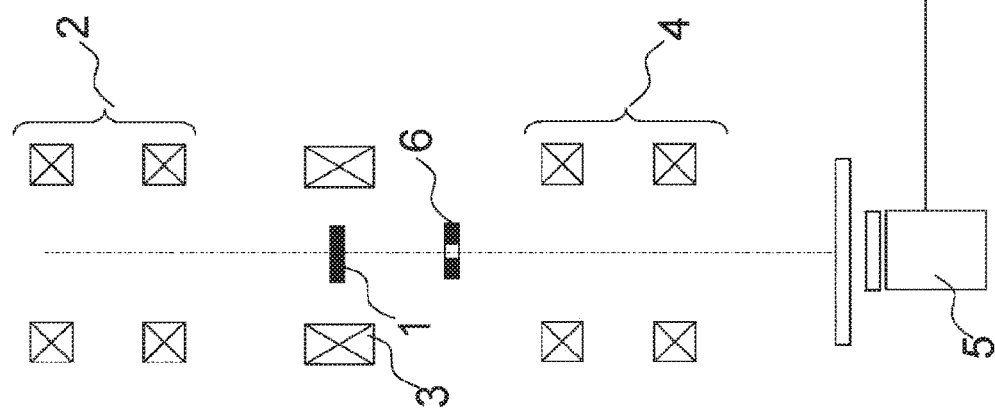

ELECTRON MICROSCOPE

TECHNICAL FIELD

The present invention relates to an electron microscope. For example, the present invention relates to a measurement apparatus that measures an electron beam and to a system that analyzes the composition and structure of an observation target based on an electron having been transmitted through the target.

BACKGROUND ART

In electron microscope observation, there are many needs for analyzing the composition and structure of an observation target. Electron microscope analysis methods include methods illustrated in NPL 1 and NPL 2. Specifically, electron microscope analysis methods include energy dispersion type X-ray analysis (NPL 1, pp 393-395), analyses by the electron energy-loss spectroscopy method (NPL 1, pp 380-384), and analyses by the electron diffraction method (NPL 1, pp 25-26). Further, analyses by the electron diffraction method include: the selected area diffraction method, in which an analysis area is selected using a selected area aperture as illustrated in NPL 1 (pp 25-26); and the micro beam diffraction method, in which an electron beam is finely focused and the electron beam is irradiated to only a specific area to select an analysis area as illustrated in NPL 2 (pp 12-13).

CITATION LIST

Non-Patent Literature

NPL 1: Experimental Physics Course 23—Electron Microscope, Edited by Chief Editor Ryoji Ueda, Kyoritsu Shuppan Co., Ltd. (1982), pp 25-26, pp 380-384, pp 393-395.
NPL 2: High-Resolution Electron Microscope—Principle and Use Method, Author: Shigeo Horiuchi, Kyoritsu Shuppan Co., Ltd. (1988), pp 12-13, pp 142-143.

SUMMARY OF INVENTION

Technical Problem

The selected area diffraction method is one analysis method using an electron microscope. In this method, as illustrated in NPL 1, a selected area aperture is inserted into an image plane of an objective lens to select an analysis area in order to analyze the composition and structure based on the electron beam diffraction pattern of the area.

In general, a selected area aperture whose diameter ranges from several μm to dozens of μm is often used in order to select an area of an observation target whose diameter ranges from several nm to dozens of nm. To insert the aforementioned aperture at the intended location, adjustment is made by enlarging the observation target between several tens of thousands times to several hundreds of thousand times. Therefore, the aforementioned location adjustment requires a precise operation. As several analysis objects often exist in one area, the aforementioned location adjustment is frequently performed.

Since a selected area aperture is inserted into the image surface of an objective lens, an electron beam is shielded by a non-aperture hole portion, and image observation cannot be performed in a non-selected area. Thereby, the operation to adjust the aperture location and optionally select an analysis area is difficult.

To conduct analysis by the selected area diffraction method, the analysis area needs to be accurately recognized. The actual analysis area is larger than the area selected by the aforementioned selected area aperture. The area is an analysis area that addresses an electro-optical error. As illustrated in NPL 2 (pp 142-143), this analysis area can be computed using the spherical aberration coefficient and focus deviation amount of an objective lens and the scattering angle of a diffraction wave. However, in the conventional location adjustment of a selected area aperture, image observation cannot be performed in a non-selected area, and it is accordingly impossible to visually confirm the aforementioned analysis area.

There is provided a selected area aperture location adjustment method. When inserting a selected area aperture and performing location adjustment in this method, an image prior to aperture insertion is shot as a map image and the aperture outline is extracted from the aforementioned image at the time of aperture insertion and drawn on the map image in order to enhance the workability. Also, there is provided an analysis area confirmation method. This method is directed to enhancing the analysis reliability by computing, based on the aforementioned aperture outline, the analysis area addressing an electro-optical error and drawing the analysis area on the aforementioned map image.

The object of the present invention is to enhance the workability of location adjustment of a selected area aperture and/or the reliability of analysis area confirmation.

Solution to Problem

The aforementioned object is achieved by the features recited in the claims. For example, the recited features include the following: a shooting means that sets spherical aberration coefficient Cs, focus deviation amount $\Delta f$, and scattering angle $\beta$, which are needed for computation of an electro-optical error, and shoots an observation area prior to selected area aperture insertion as a map image; a storage means that stores the map image; an extraction means that extracts an outline by shooting the observation area after the aforementioned aperture insertion; a computation means that computes an analysis area addressing an electro-optical error; a drawing means that draws the outline on the aforementioned map image; and a display means that displays the drawn image. The problem can be solved by displaying, on the aforementioned display means, a drawn image generated by drawing the outline, which is extracted by the aforementioned extracting means, on the map image shot by the aforementioned shooting means. Alternatively, the problem can be solved by displaying, on the aforementioned display means, a drawn image generated by drawing the analysis area, which is computed by the computation means based on the outline extracted by the aforementioned extraction means, on the map image shot by the aforementioned shooting means.

Advantageous Effects of Invention

According to the present invention, workability enhancement by location adjustment of a selected area aperture and/or enhancement of reliability in analysis area confirmation can be achieved. For example, when inserting a selected area aperture and performing location adjustment, the locational relationship between the aperture and the observation area can be visually recognized, and location adjustment to move the aperture to an optional analysis area can be readily performed. Thereby, it is possible to enhance the work efficiency of analysis by the selected area diffraction method using an electron microscope. Also, the diameter of the outline indicating the location of the aforementioned aperture is an analysis area addressing an electro-optical error. As the analysis area in the observation area can be visually confirmed, it is possible to enhance the reliability of analysis by the selected area diffraction method using an electron microscope.

BRIEF DESCRIPTION OF DRAWINGS

FIG. 1 is a general diagram of an apparatus configuration according to this example.

DESCRIPTION OF EMBODIMENTS

Figure 2:
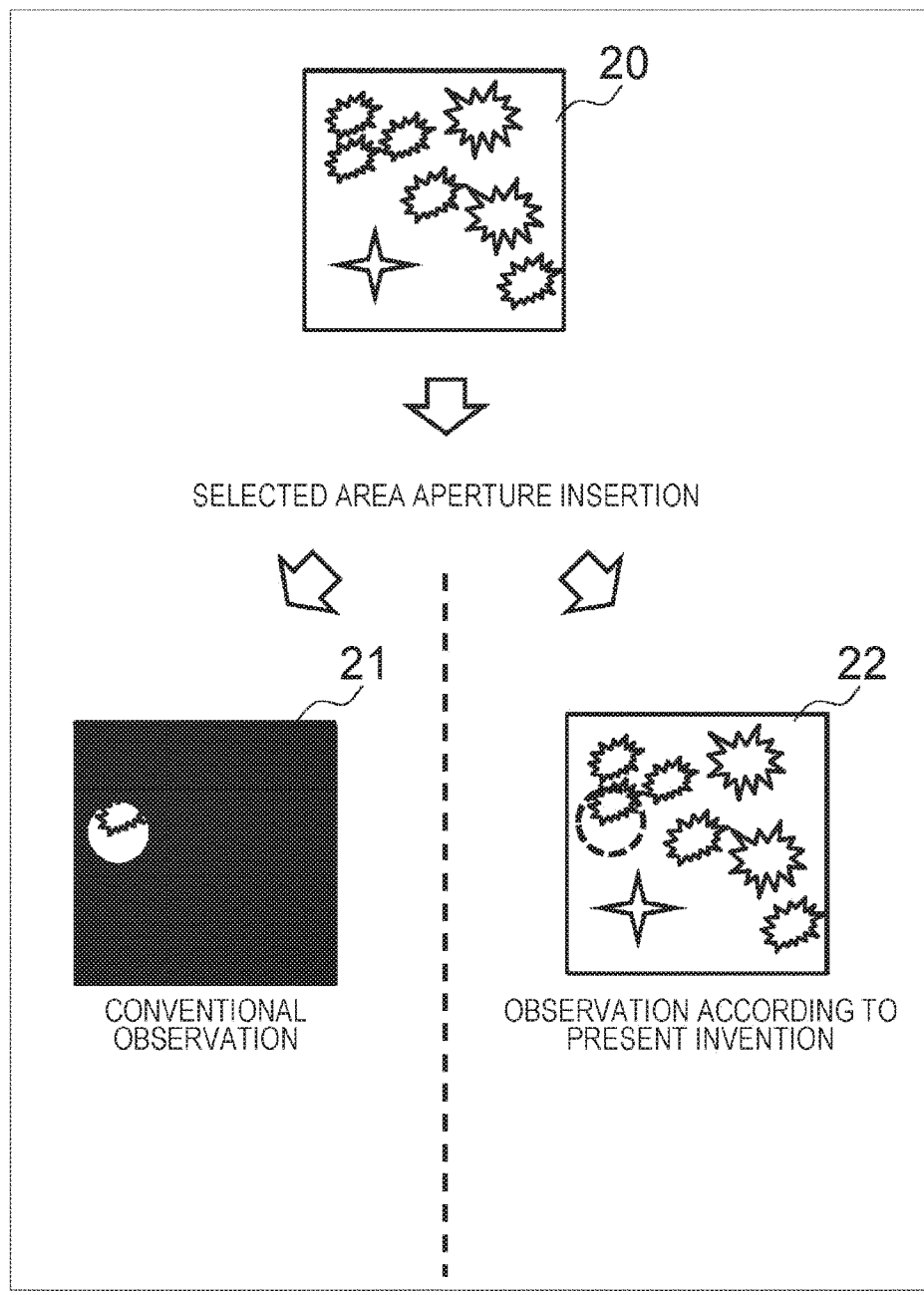
FIG. 2 is a diagram comparing a selected area aperture location adjustment method according to the prior art and a selected area aperture location adjustment method according to the present invention.

Hereinafter, the embodiments of the present invention are illustrated in reference to the drawings. Specific illustrations are hereinafter made for the sake of enhancing the understanding of the invention, but the illustrations are not directed to limiting the scope of the invention.

Example 1

According to this example, there is provided a selected area aperture location adjustment method. In this method, a map image shot prior to insertion of a selected area aperture and an outline extracted from the image at the time of insertion of the aperture are used to visually confirm the locational relationship between an analysis target and the aforementioned aperture so that the location of the aforementioned aperture can be adjusted.

FIG. 1 illustrates a configuration of an apparatus according to this example.

An electron microscope according to this example includes: an irradiation lens system 2 that irradiates an electron beam to a sample 1; an objective lens system 3 for focusing on the sample; an image forming lens system 4 that forms an image of an electron beam transmitted through the sample; an image detection unit 5 that detects the formed image; a selected area aperture 6 that selects an analysis range; a computer 7 that performs various types of operation control processing; an operation device 8 inside the computer; a storage device 9 that stores data; a signal transmission unit 10 that transmits a signal from the image detection unit to the computer; an input device 11 for inputting a parameter; and an output device 12 for outputting the image.

FIG. 2 compares a selected area aperture location adjustment method according to the prior art and a selected area aperture location adjustment method according to this example.

Conventionally, when a selected area aperture is inserted subsequent to determining an observation area 20, a large portion of the area is darkened by the shadow of the aperture, and it is difficult to recognize the locational relationship of the aforementioned aperture in the observation area (reference numeral 21). Thereby, conventionally, location adjustment for moving the aforementioned aperture to an optional analysis area is difficult. To the contrary, according to this example, when the aforementioned aperture is inserted into the observation area, the locational information of the aperture is displayed by the outline only, and a large portion of the area is not darkened (reference numeral 22). Thereby, the locational relationship of the aforementioned aperture in the observation area can be readily recognized, and location adjustment for moving the aforementioned aperture to an optional analysis area can be readily performed.

Figure 3:
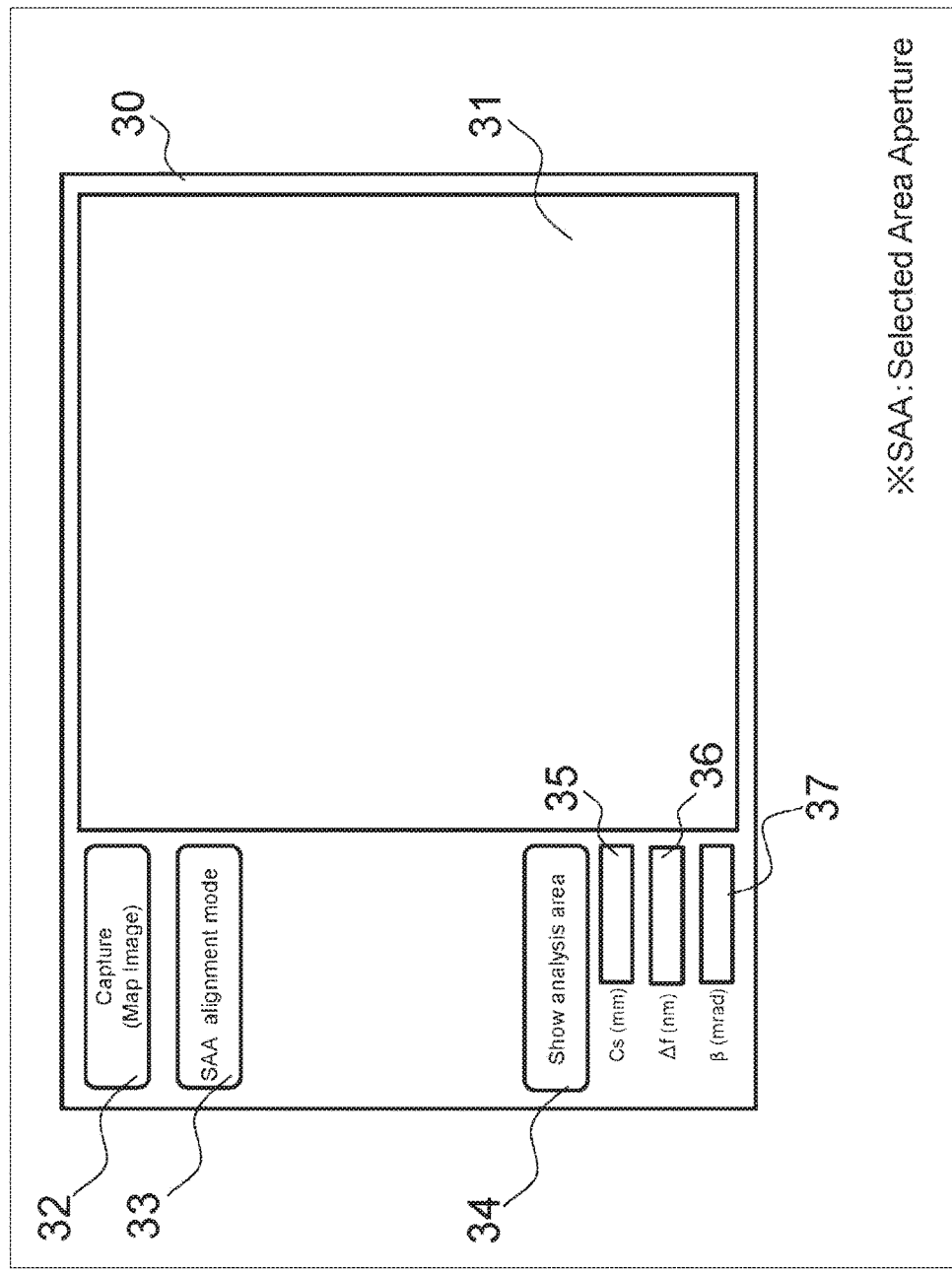
FIG. 3 is a general diagram of a GUI of the present system displayed on an output device 12.

FIG. 3 is a general diagram of a GUI of this system displayed on the output device 12. On a main window 30 of the GUI, the following units exist: an image display unit 31; a total of three execution units—i.e., a map image shooting execution unit 32, an SAA alignment mode execution unit 33, and a Show analysis area execution unit 34; and a total of three numerical value input units—i.e., a spherical aberration coefficient Cs input unit 35, a focus deviation amount Δf input unit 36, and a scattering angle β input unit 37.

The processing according to this example can be performed by, after determining the observation area, pressing the map image shooting execution unit 32 to shoot a map image and in turn pressing the SAA alignment mode execution unit 33. The Show analysis area execution unit 34, which is one of the aforementioned execution units, and the three numerical value input units are features used in Example 2. These units do not need to be displayed in an embodiment of Example 1.

Figure 4:
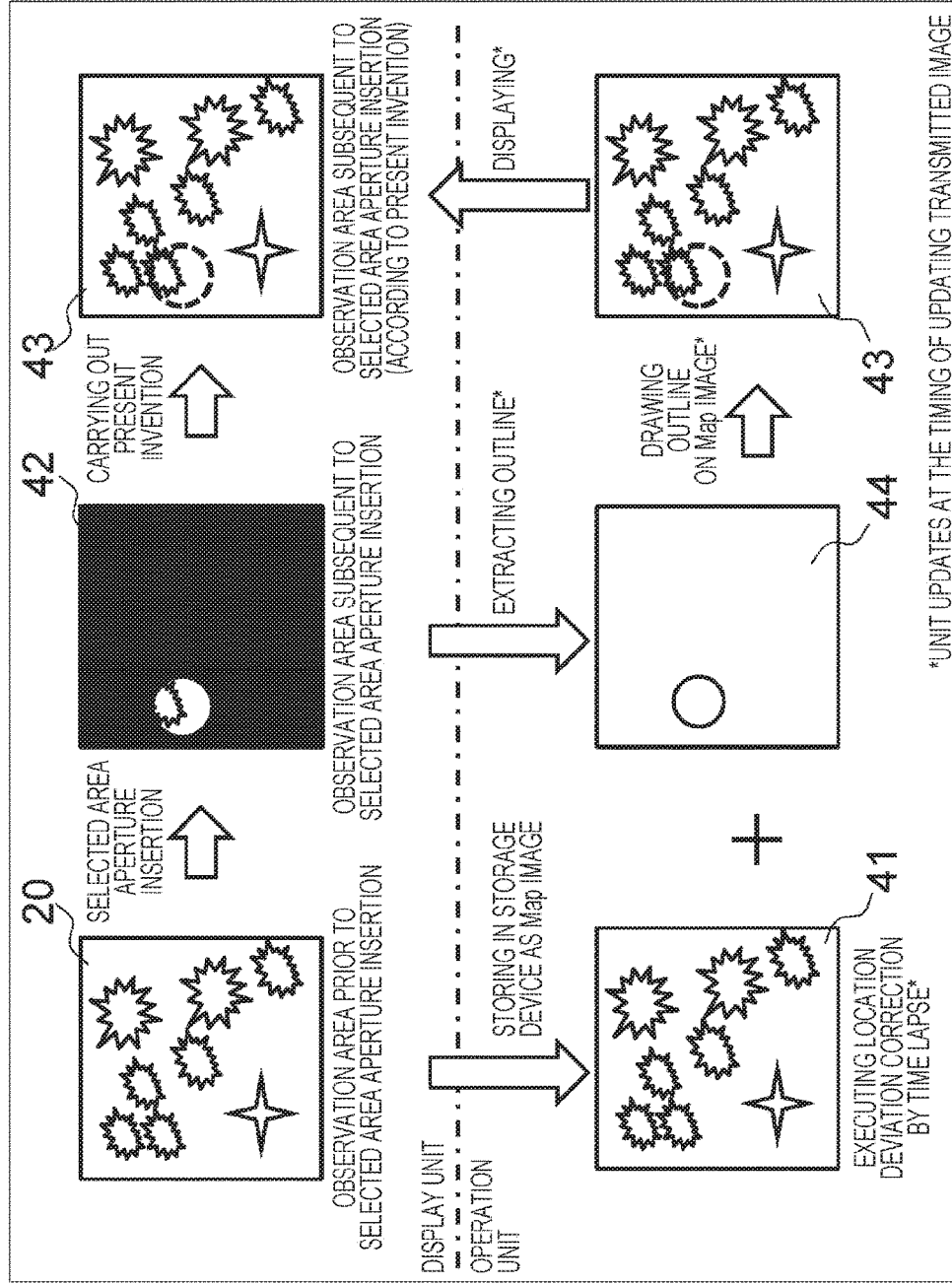
FIG. 4 is a general diagram according to the present invention (First Embodiment).

FIG. 4 illustrates a general diagram of this example, and the outline of this example is illustrated by referring to FIGS. 3 and 4.

Figure 5A:
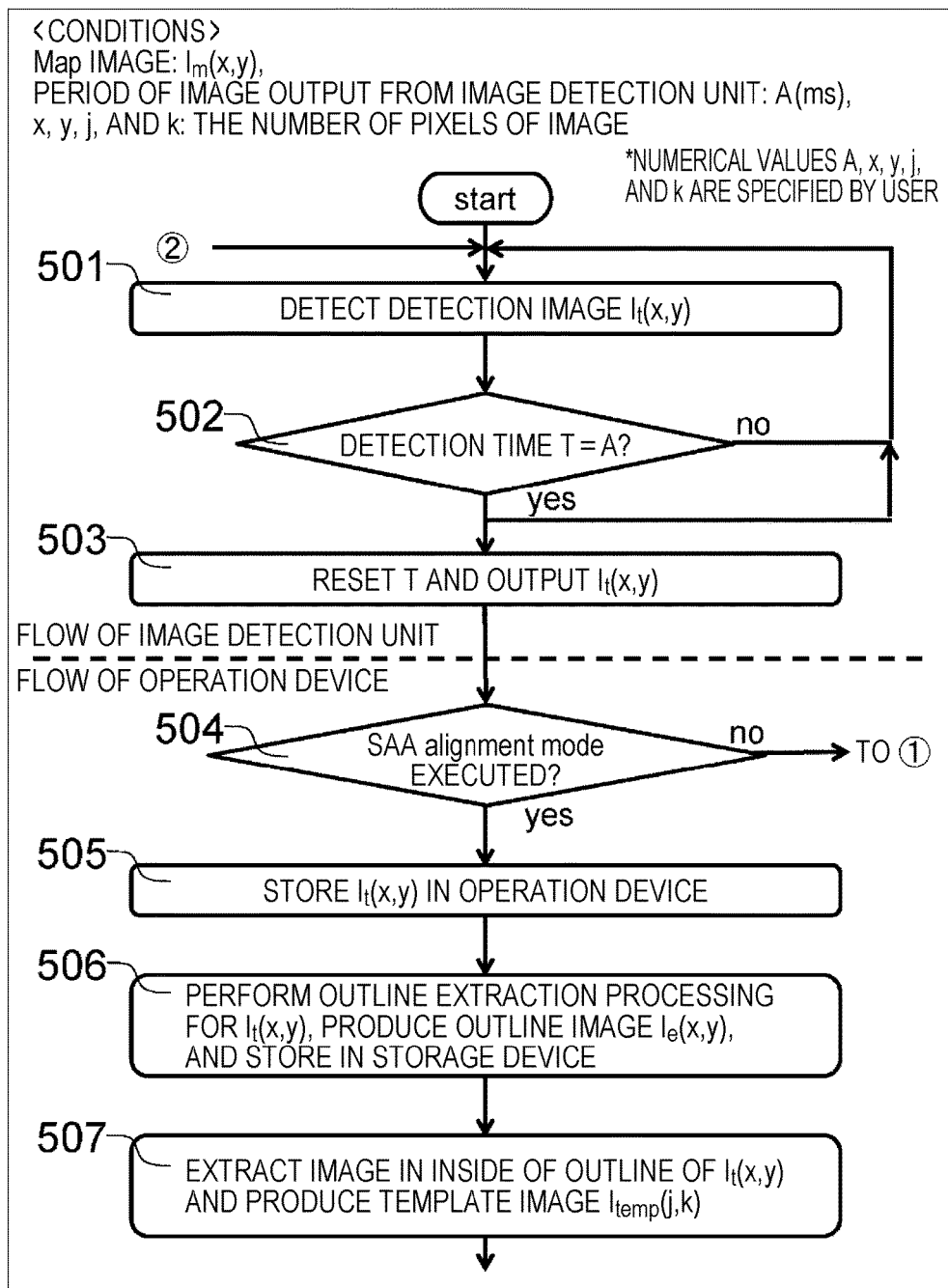
FIG. 5A is a flowchart (first half) of an operation unit according to the present invention (Example 1).
Figure 5B:
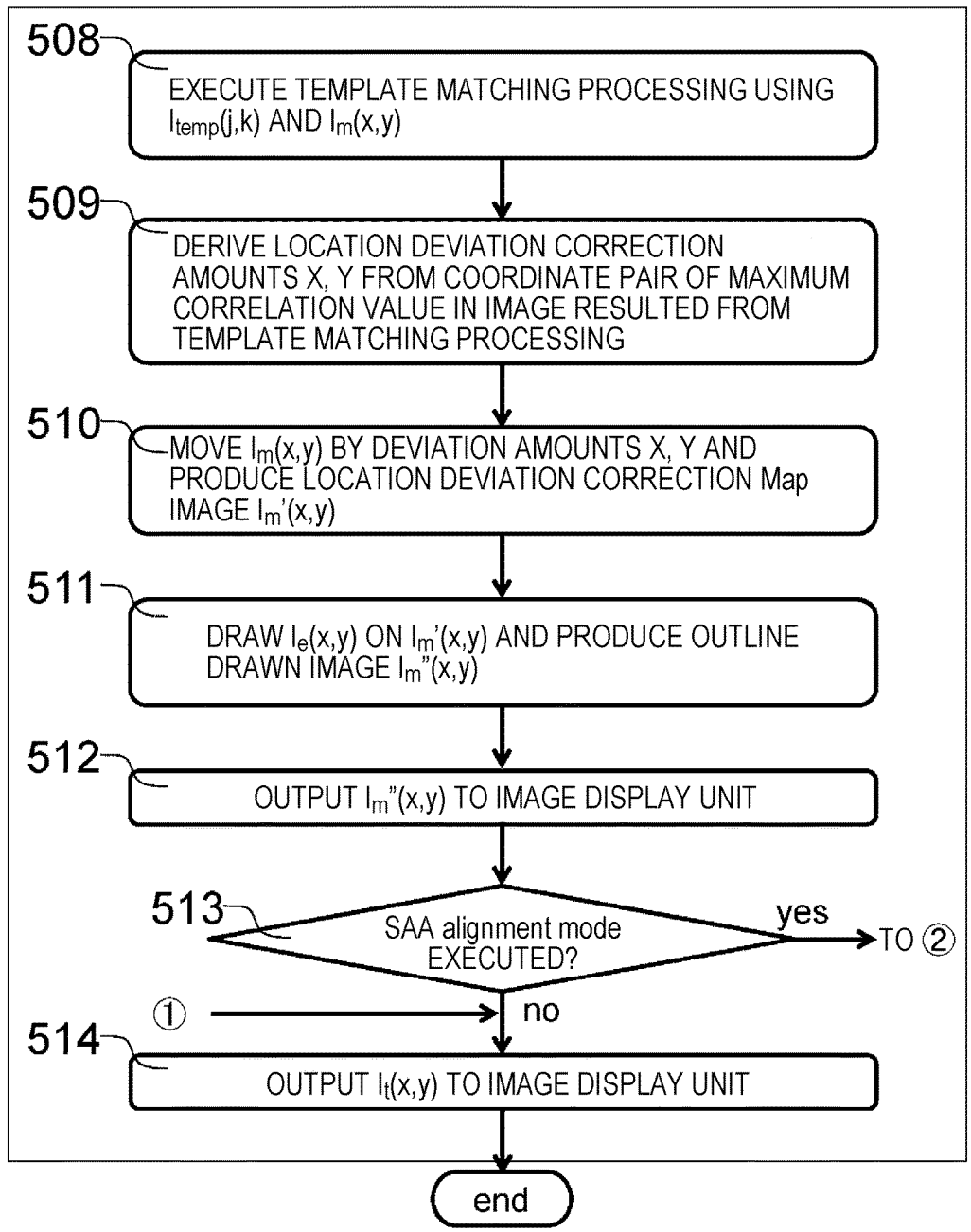
FIG. 5B is a flowchart (second half) of the operation unit according to the present invention (Example 1).

In this example, the map image shooting execution unit 32 is pressed to shoot the observation area 20 by the image detection unit 5 so as to be stored as a map image 41 in the storage device 9. Subsequently, the selected area aperture 6 is inserted into the observation area (reference numeral 42), and the SAA alignment mode execution unit 33 is pressed, whereby a drawn image (reference numeral 43) drawn by an outline that indicates positional information of the aforementioned aperture in the observation area are displayed on the image display unit 31. During execution of the SAA alignment mode, by the operation device 8, the aforementioned map image, an outline extraction image 44, and the aforementioned drawn image are updated in synchronization with a detection image transmitted from the image detection unit. At the time of updating, the location deviation caused by a lapse of time is corrected for the map image, a new outline is extracted from the aforementioned detection image for the outline extraction image. Also, the drawn image is updated at the above timing as an image generated by drawing the outline on the map image, and the drawn image is displayed on the image display unit. FIG. 5 shows a flowchart of the operation unit according to the present invention (Embodiment 1).

The below-mentioned flow assumes the following: the map image 41 has been shot and stored as $I_m$ (x,y) in the storage device 9; the period of image output from the image detection unit 15 is set to A (ms); the number of pixels is denoted by x, y and j, k; and the numerical values A, x, y, j, and k can be optionally set by a user.

In step 501, the observation area 20, into which the selected area aperture 6 is inserted, is detected by the image detection unit as a detection image $I_t$ (x,y). In step 502, whether a detection time T of the detection image $I_t$ (x,y) is equal to an image output period A is determined. When the detection time T and the image output period A are equal, the image detection unit resets the detection time T and outputs the detection image $I_t$ (x,y) (step 503). After the image detection unit resets the detection time T, the image detection unit again starts detection of the detection image $I_t$ (x,y). The detection image $I_t$ (x,y) is transmitted via the signal transmission unit 10 to the computer 7 that performs operation control processing. In step 504, whether to execute the SAA alignment mode is determined. In the case of "yes," the detection image $I_t$ (x,y) is stored in the operation device 8 (step 505). In the case of "no," the detection image $I_t$ (x,y) is output to the image display unit 31 (step 514). In step 506, outline extraction processing using, e.g., a differentiation filter is performed for the detection image $I_t$ (x,y) to produce an outline image $I_e$ (x,y) and store the outline image $I_e$ (x,y) in the storage device. In step 507, the image in the inside of the outline of the detection image $I_t$ (x,y) is extracted to produce a template image $I_{temp}$ (j,k). The template image $I_{temp}$ (j,k) is used as a template to perform template matching processing with the aforementioned map image $I_m$ (x,y) is performed. Based on the processing result, the location deviation amount of the map image $I_m$ (x,y) with reference to the detection image $I_t$ (x,y) is measured to derive location deviation correction amounts X, Y (steps 508, 509). In step 510, the map image $I_m$ (x,y) is moved by the location deviation correction amounts X, Y to produce a location deviation correction map image $I_m'$ (x,y). In step 511, the aforementioned outline image $I_e$ (x,y) is drawn on the map image $I_m'$ (x,y) to produce an outline drawn image $I_m''$ (x,y) and output the outline drawn image $I_m''$ (x,y) to the image display unit (step 512). In step 513, whether the SAA alignment mode is executed is determined. In the case of "yes," detection of the detection image $I_t$ (x,y) is conducted again and repeated until the determination changes to "no." In the case of "no," the detection image $I_t$ (x,y) is output to the image display unit, and the processing ends after going back to the original observation state (step 514).

By virtue of the above-mentioned processing, the locational relationship between the selected area aperture and the observation area can be visually recognized at an image output period. Location adjustment for moving the aforementioned aperture to an optional analysis area can be readily performed. Thereby, it is possible to enhance the work efficiency of analysis by the selected area diffraction method using an electron microscope.

According to the aforementioned example, the map image, outline image, and outline drawn image are equal in terms of the number of pixels. However, the present invention is applicable to the situation where the aforementioned images are different in terms of the number of pixels. According to the aforementioned example, template matching processing is employed for deriving the location deviation correction amount between the detection image and the map image. According to the present invention, another algorism for deriving the location deviation correction amount can be employed.

According to the aforementioned example, a differentiation filter is employed for outline extraction processing. However, according to the present invention, another algorism for outline extraction processing can be employed.

According to the aforementioned example, the location deviation correction amount is derived after the outline is extracted. However, according to the present invention, the outline can be extracted after deriving the location deviation correction amount.

According to the aforementioned example, it is described that the numerical values A, x, y, j, and k are specified by a user. However, according to the present invention, these numerical value can be automatically set.

According to the aforementioned example, an outline is drawn. However, according to the present invention, an image in the inside of the outline can be drawn.

According to the aforementioned example, it is described that an outline is drawn on a map image. However, according to the present invention, an outline can be displayed on a map image by combining the outline image and the map image.

According to the present invention, it is possible to enhance the work efficiency of analysis by the selected area diffraction method using an electron microscope, and application to the material analysis field can be expected. As can be seen in the fact that the work efficiency for orientation alignment in an optionally selected area can be addressed in observation of, e.g., a semiconductor device, application to non-analysis purposes can be expected as well.

Second Embodiment

According to this example, there is provided a selected area aperture location adjustment method. In this method, a map image shot prior to insertion of a selected area aperture and an outline extracted from the image at the time of insertion of the aperture are used to visually confirm the locational relationship between an analysis target and the aforementioned aperture in order to adjust the location of the aforementioned aperture. According to the second embodiment, the reliability of analysis can be enhanced by changing the diameter of an outline indicating the location of the aforementioned aperture and drawing an analysis area addressing an electro-optical error.

This example is identical to Example 1 in terms of the apparatus configuration and the outline of the processing. Therefore, the apparatus configuration and the outline of the processing according to this example are not hereinafter illustrated.

According to Example 1, in an observation area, an outline of a selected area aperture is drawn on a drawn image (reference numeral 43), which is drawn by an outline indicating locational information on the aforementioned selected area aperture. According to this example, the diameter of the outline indicating the aperture location is changed, and an analysis area addressing an electro-optical error is drawn.

Figure 6:
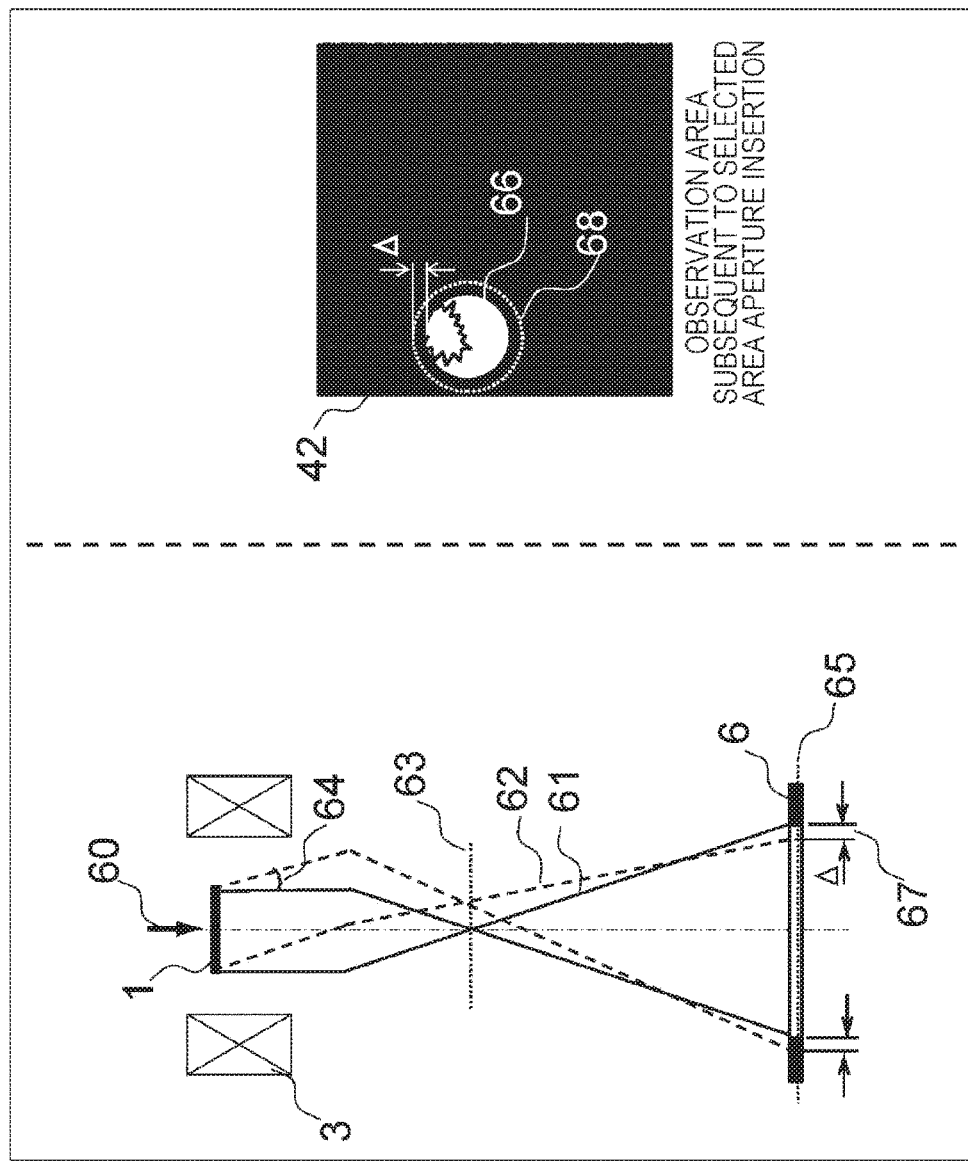
FIG. 6 is a diagram illustrating an analysis area addressing an electro-optical error.

By referring to FIG. 6, the analysis area addressing an electro-optical error is illustrated. During an observation at the exact focus when the objective lens system is free from spherical aberration, an incident electron beam 60 is transmitted through the sample 1 and turned into a transmission wave 61 and a diffraction wave 62. These two waves are reflected by the objective lens system 3 and converge for every scattering angle β 64 on a focal plane 63. In turn, these two waves converge at each location of the sample on an image surface 65 of the objective lens system. As the selected area aperture 6 is in general inserted into the image surface portion, an area 66 selected by the aperture of the observation area 42 is the analysis area. However, in reality, it is often the case that spherical aberration occurs on the objective lens system and that the focus is deviated during observation. Accordingly, the aforementioned two waves do not converge on the aforementioned image surface, and a deviation amount 67, which is denoted by Δ, is produced on the aforementioned image surface. Due to this deviation amount Δ, the analysis area becomes larger than the area selected by the selected area aperture (this area is defined as an analysis area 68 addressing an electro-optical error). The aforementioned deviation amount Δ can be computed by the following equation:

[Equation 1]

$$\Delta = C_s \cdot \beta^3 - \Delta f \beta \quad (1)$$

where
Cs: spherical aberration coefficient; and
Δf: focus deviation amount.

As described above, as the aforementioned analysis area is larger than the aforementioned area selected by the aperture. In the conventional observation, it is not possible to visually recognize the area that is outside the area selected by the aforementioned aperture and within the analysis area. According to the present invention, by changing the diameter of the outline indicating the selected area aperture location, which is drawn according to Example 1, and by drawing an analysis area addressing an electro-optical error, the aforementioned analysis area can be visually recognized. This embodiment is hereinafter illustrated.

Figure 7:
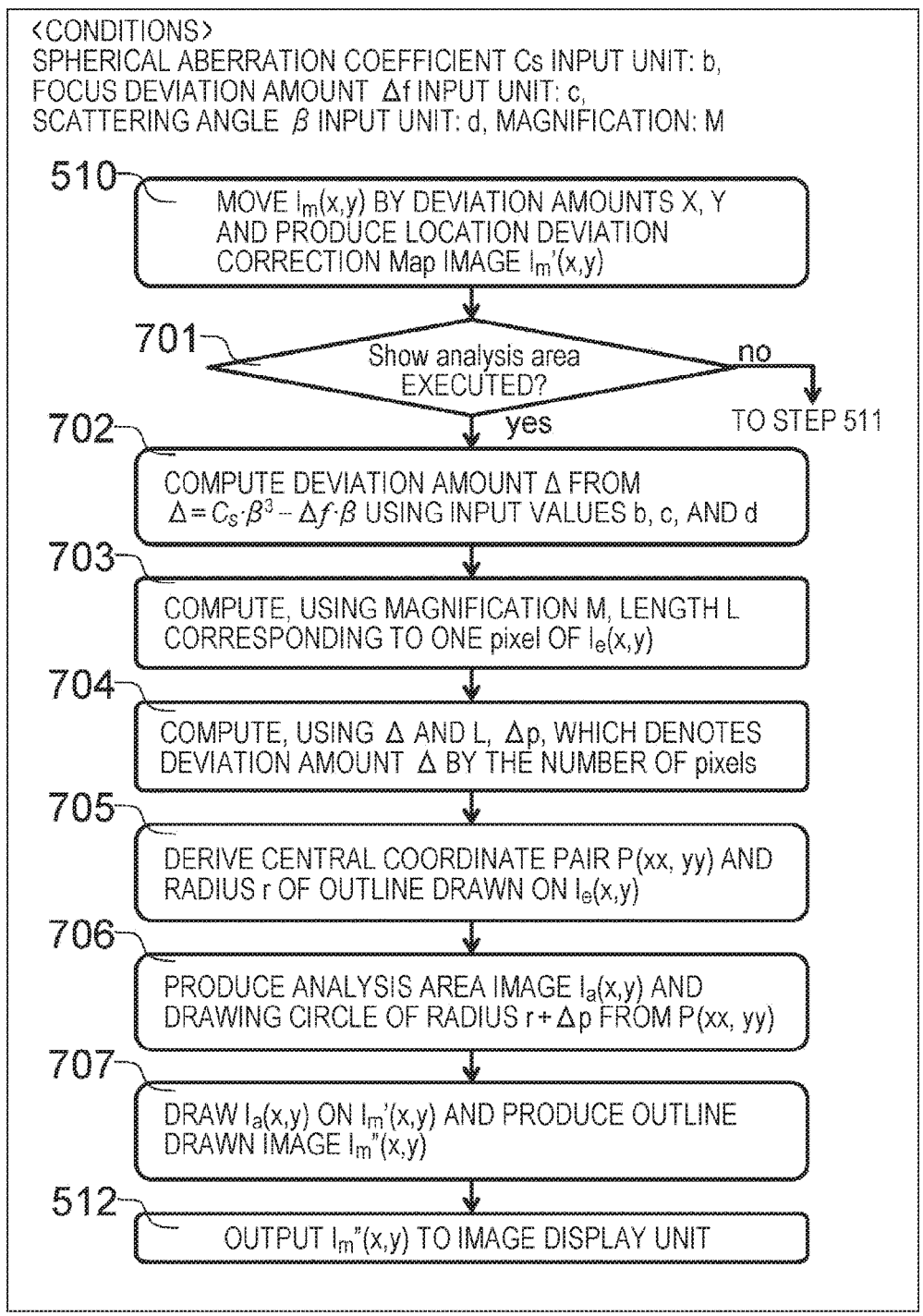
FIG. 7 is a flowchart of the operation unit according to the present invention (Example 2).

FIG. 7 is a flowchart of an operation unit according to this example. The processing before step 510 and after step 512 is not hereinafter illustrated since this processing is identical to the processing of the First Embodiment. According to the Second Embodiment, in addition to the conditions of the First Embodiment, the following conditions are needed: numerical values b, c, and d are input, respectively, into the spherical aberration coefficient Cs input unit 35, the focus deviation amount Δf input unit 36, and the scattering angle β input unit, all of which are illustrated in FIG. 3. Under these settings, the Show analysis area execution unit 34 is pressed to execute the Show analysis area. Also, the magnification M of an image detected by the image detection unit 5 is known. In step 701, whether to execute the Show analysis area is determined. In the case of "yes," the aforementioned three input values b, c, and d are used in the following equation:

[Equation 2]

$$\Delta = C_s \cdot \beta^3 - \Delta f \cdot \alpha \quad (2)$$

From the above equation, the deviation amount Δ is computed (step 702). In the case of "no," the procedure proceeds to the processing of step 511 of Example 1. In step 703, a length L, which is an equivalent of one pixel of an outline image $I_e(x,y)$, is computed using the aforementioned magnification M. In step 704, an amount Δp, which denotes the deviation amount Δ by the number of pixels, is computed using the deviation amount Δ and the length L. In step 705, a central coordinate pair P (xx, yy) of an outline drawn on the outline image $I_e(x,y)$ and a radius r of the outline are derived. In step 706, an analysis area image $I_a(x,y)$ is newly produced, and a circle is drawn such that the center is the aforementioned coordinate pair P (xx, yy) and that the radius is equal to the sum of the aforementioned radius r and the aforementioned deviation amount Δp. In step 707, the analysis area image $I_a(x,y)$ is drawn on the location deviation correction map image $I_m'(x,y)$, and the outline drawn image $I_m''(x,y)$ is produced and output to the image display unit (step 512).

By virtue of the foregoing processing, the diameter of the outline indicating the selected area aperture location is an equivalent of the analysis area addressing an electro-optical error. As an analysis area in the observation area can be visually recognized, the analysis reliability can be enhanced.

According to the aforementioned example, an analysis area addressing an electro-optical error is drawn as a circle. However, according to the present invention, it is possible to draw the analysis area to which the deviation amount Δ is increased in reference to the extracted outline.

According to the aforementioned example, one analysis area addressing an electro-optical error is drawn. However, according to the present invention, a plurality of analysis areas with different focus deviation amounts Δf and different scattering angles β can be simultaneously drawn.

According to the aforementioned example, an analysis area addressing an electro-optical error is drawn on a map image. However, according to the present invention, an analysis area addressing an electro-optical error and a map image can be combined to display the analysis area addressing an electro-optical error on the map image.

REFERENCE SIGNS LIST 1 sample
2 irradiation lens system
3 objective lens system
4 image forming lens system
5 image detection unit
6 selected area aperture
7 computer
8 operation device
9 storage device
10 signal transmission unit
11 input device
12 output device
20 observation area
21 conventional observation area
22 observation area according to the present invention
30 GUI main window
31 image display unit
32 map image shooting execution unit
33 SAA alignment mode execution unit
34 Show analysis area execution unit
35 spherical aberration coefficient Cs input unit
36 focus deviation amount Δf input unit
37 scattering angle β input unit
41 map image
42 observation area after selected area aperture insertion
43 image where locational information of selected area aperture is drawn as outline in observation area
44 outline extraction image sample
60 incident electron beam
61 transmission wave
62 diffraction wave
63 focal plane of objective lens system
64 scattering angle β
65 image surface of objective lens system
66 area selected by selected area aperture
67 deviation amount of transmission wave and diffraction wave on image surface of objective lens system
68 analysis area addressing electro-optical error

The invention claimed is:

1. An electron microscope having:
an irradiation lens system configured to irradiate an electron beam to an observation target;
an objective lens system configured to focus on the observation target;
a detection device configured to detect a response from the observation target;
an image forming lens system configured to adjust a size of the observation target to a specified size when the observation target is projected on the detection device;
a selection mechanism configured to select an area of the observation target projected on the detection device; and
a display device configured to display an image produced by an operation device or an image detected by the detection device,
the electron microscope comprising:
a first detection means configured to detect, by the detection device, an image in which an observation range of the observation target is not selected by the selection mechanism;
a storage means configured to store an image detected by the first detection means;
a second detection means configured to detect, by the detection device, an image in which an observation range of the observation target is selected by the selection mechanism;
an extraction means configured to extract an outline of the selection mechanism from the image detected by the second detection means;
the operation device configured to draw the outline, which is extracted by the extraction means, on an image shot by the first detection means; and
a display configured to display the image drawn by the operation device.

2. The electron microscope according to claim 1, wherein an image in an inside of the outline of the image detected by the second detection means is located on the image detected by the first detection means.

3. The electron microscope according to claim 1, wherein the image detected by the second detection means and the image drawn by the operation device are displayed on a different display.

4. The electron microscope according to claim 1, wherein a magnification of the image displayed on the display means can be optionally set.

5. An electron microscope having:
an irradiation lens system configured to irradiate an electron beam to an observation target;
an objective lens system configured to focus on the observation target;
a detection device configured to detect a response from the observation target;
an image forming lens system configured to adjust a size of the observation target to a specified size when the observation target is projected on the detection device;
a selection mechanism configured to select an area of the observation target projected on the detection device;
an input device configured to input a plurality of types of numerical values;
and
a display device configured to display an image produced by an operation device or an image detected by the detection device,
the electron microscope comprising:
a first detection means configured to detect, by the detection device, an image in which an observation range of the observation target is not selected by the selection mechanism;
a storage means configured to store the image detected by the first detection means;
a second detection means configured to detect, by the detection device, an image in which the observation range of the observation target is selected by the selection mechanism;
an extraction means configured to extract an outline of the selection mechanism from the image detected by the second detection means;
the operation device configured to compute, using the numerical value input by the input device, an analysis area addressing an electro-optical error;
the operation device configured to draw a new outline that reflects a result of computation by the operation device based on the outline extracted by the extraction means;
the operation device configured to draw the new outline on an image shot by the first detection means; and
a display configured to display the image drawn by the operation device.

6. The electron microscope according to claim 5, wherein an image in an inside of the outline of the image detected by the second detection means is located on the image detected by the first detection means.

7. The electron microscope according to claim 5, wherein the image detected by the second detection means and the image drawn by the operation device are displayed on a different display.

8. The electron microscope according to claim 5, wherein a magnification of the image displayed on the display can be optionally set.

9. The electron microscope according to claim 5, wherein a plurality of the analysis areas, which are computed by the operation device, are computed under different conditions, and a plurality of lines are drawn by the operation device.

10. The electron microscope according to claim 6, wherein the numerical values are set based on a condition of the electron microscope.

* * * * *